(12) United States Patent
Shen et al.

(10) Patent No.: US 9,887,350 B2
(45) Date of Patent: Feb. 6, 2018

(54) MTJ ETCHING WITH IMPROVED UNIFORMITY AND PROFILE BY ADDING PASSIVATION STEP

(71) Applicant: Headway Technologies, Inc., Milpitas, CA (US)

(72) Inventors: Dongna Shen, San Jose, CA (US); Yu-Jen Wang, San Jose, CA (US); Jesmin Haq, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/726,545

(22) Filed: May 31, 2015

(65) Prior Publication Data

US 2016/0351798 A1    Dec. 1, 2016

(51) Int. Cl.
*H01L 21/00*        (2006.01)
*H01L 43/12*        (2006.01)

(52) U.S. Cl.
CPC .................................... *H01L 43/12* (2013.01)

(58) Field of Classification Search
CPC ............................... H01L 73/08; H01L 27/222
See application file for complete search history.

(56) References Cited

U.S. PATENT DOCUMENTS

| | | | |
|---|---|---|---|
| 6,395,621 B1 | 5/2002 | Mizushima et al. | |
| 7,001,783 B2 | 2/2006 | Costrini et al. | |
| 7,169,654 B2 | 1/2007 | Zia et al. | |
| 7,471,445 B2 | 12/2008 | Pan | |
| 7,593,193 B2 | 9/2009 | Inomata et al. | |
| 8,450,119 B2 | 5/2013 | Tomg et al. | |
| 8,716,072 B2 | 5/2014 | Bangsaruntip et al. | |
| 8,722,543 B2 | 5/2014 | Belen et al. | |
| 2010/0240151 A1* | 9/2010 | Belen .................. | H01L 43/12 438/3 |
| 2010/0311243 A1* | 12/2010 | Mao .................. | H01L 27/222 438/694 |
| 2012/0028373 A1* | 2/2012 | Belen .................. | H01L 43/12 438/3 |
| 2012/0139019 A1* | 6/2012 | Iba .................. | H01L 43/12 438/3 |

\* cited by examiner

*Primary Examiner* — Zandra Smith
*Assistant Examiner* — Andre Stevenson
(74) *Attorney, Agent, or Firm* — Saile Ackerman LLC; Stephen B. Ackerman; Rosemary L.S. Pike

(57) ABSTRACT

A hard mask stack for etching a magnetic tunneling junction (MTJ) structure is described. An electrode layer is deposited on a stack of MTJ layers on a bottom electrode. A photoresist mask is formed on the electrode layer. The electrode layer is etched away where it is not covered by the photoresist mask to form a metal hard mask. The metal hard mask is passivated during or after etching to form a smooth hard mask profile. Thereafter, the photoresist mask is removed and the MTJ structure is etched using the metal hard mask wherein the metal hard mask remaining acts as a top electrode. The resulting MTJ device has smooth sidewalls and uniform device shape.

17 Claims, 1 Drawing Sheet

MTJ ETCHING WITH IMPROVED UNIFORMITY AND PROFILE BY ADDING PASSIVATION STEP

TECHNICAL FIELD

This application relates to the general field of magnetic tunneling junctions (MTJ) and, more particularly, to etching methods for forming MTJ structures.

BACKGROUND

Tantalum (Ta) is one of the best hard masks for MTJ reactive ion etching (RIE) due to a very low etching rate using Methanol and high etching selectivity to MTJ materials. Usually, a Ta hard mask is patterned by a dielectric hard mask, for example silicon dioxide ($SiO_2$) or silicon nitride ($SiN_x$), and the dielectric hard mask is patterned by photoresist (PR). This is because there will be a fencing issue if PR is used directly to pattern Ta. However, $SiO_2$ etching by high $SiO_2$/PR selectivity chemical etching, e.g. $C_4F_8$, will generate severe striations around the $SiO_2$ sidewall which will transfer to the Ta and even to the MTJ sidewall and lead to rough sidewalls and poor uniformity within the chip. Etching $SiO_2$ by $CF_4$ usually has much less sidewall striation; however, the poor $SiO_2$/PR selectivity will limit the thickness of $SiO_2$ and also Ta that can be etched with the same thickness PR.

Several patents show the use of various hard masks in etching MTJ stacks. These include U.S. Pat. No. 8,722,543 (Belen et al), U.S. Pat. No. 8,450,119 (Torng et al), U.S. Pat. No. 7,593,193 (Inomata et al), and U.S. Pat. No. 7,001,783 (Costrini et al). Other patents show passivating processes: U.S. Pat. No. 7,169,654 (Zia et al), U.S. Pat. No. 6,395,621 (Mizushima et al), U.S. Pat. No. 8,716,072 (Bangsaruntip et al), and U.S. Pat. No. 7,471,445 (Pan). The process of the present disclosure is not taught or suggested by any of these references.

SUMMARY

It is an object of the present disclosure to provide a hard mask and an etching scheme to improve etching profile and etching uniformity in forming MTJ structures.

Yet another object of the present disclosure is to provide a hard mask and etching scheme for MTJ structures wherein a thick Ta layer remains as a top electrode without increasing the thickness of a photoresist layer.

In accordance with the objectives of the present disclosure, a method for etching a magnetic tunneling junction (MTJ) structure is achieved. A stack of MTJ layers is provided on a bottom electrode. An electrode layer is deposited on the stack of MTJ layers. A photoresist mask is formed on the electrode layer. The electrode layer is etched away where it is not covered by the photoresist mask to form a metal hard mask. The metal hard mask is passivated during or after etching to form a smooth hard mask profile. Thereafter, the photoresist mask is removed and the MTJ structure is etched using the metal hard mask wherein the metal hard mask remaining acts as a top electrode. The resulting MTJ device has smooth sidewalls and uniform device shape.

BRIEF DESCRIPTION OF THE DRAWINGS

In the accompanying drawings forming a material part of this description, there is shown.

DETAILED DESCRIPTION

The present disclosure provides a method of etching the whole MTJ structure to make the electric isolation between MTJ junctions. This method can improve etching uniformity and etching profile within wafers and within chips. For example, a STT-RAM (spin transfer torque random access memory) can be manufactured based on a Ta (or TaN, Ti, TiN, W, etc.)/PR etching mask scheme. Usually when PR is used to directly pattern a metal hard mask layer, fencing occurs. The fencing issue can be solved by a passivation step, which is to purge $O_2$, $H_2O$ vapor, or air into the chamber or to treat the wafer by low power $O_2$ plasma after the metal hard mask opening or in between metal hard mask etching steps but before the PR strip, or to expose the wafer to air, or to water-rinse the wafer after metal etching This passivation step can generate a more uniform etching profile with smoother sidewalls. This method can also generate thick Ta remaining as the top electrode without increasing the thickness of the PR.

One previous method of etching a MTJ stack used a hard mask stack of Ta/$SiO_2$/PR, in which Ta was also used for the top electrode of the MTJ. The $SiO_2$ (or similar dielectric layer) was defined by PR and etched by $CF_4$. The Ta (or similar metal layer) was defined by $SiO_2$ and etched by $CF_4$. Then, the Ta layer was used as the MTJ etching mask and as the top electrode after the MTJ etch.

Etch rate and selectivity are listed in Table I and Table II.

TABLE I

Etch Rate of Different MTJ Etch Mask Materials.

| Material | Etch Rate (nm/min) in $CF_4$ | Etch Rate (nm/min) in $CH_3OH$ |
|---|---|---|
| PR | 203.40 | NA |
| Ta | 83.4 | 4.10 |
| SiO2 | 126.00 | 26.70 |

TABLE II

Etching Selectivity in $CF_4$ of Different MTJ Etch mask Materials

| Materials | Etch Selectivity |
|---|---|
| $SiO_2$/PR | 0.62 |
| Ta/$SiO_2$ | 0.66 |
| Ta/PR | 0.41 |

The old MTJ etch using Ta/$SiO_2$/PR masks has more limitations to generating good uniformity and smooth sidewalls. One reason is the necessity to transfer the pattern twice. Although the selectivity of Ta/$SiO_2$/PR using $CF_4$ is comparable to Ta/PR using $CF_4$, as shown in Table II, a $SiO_2$ protection layer (~150-200 A) was required before PR strip to obtain a better profile, which limited Ta thickness although thicker Ta is always desired. PR strip also will consume $SiO_2$, which will limit the Ta thickness even further. However, $CF_4$ can generate a relatively smoother sidewall than other high selectivity etch chemistries.

Figure 1:
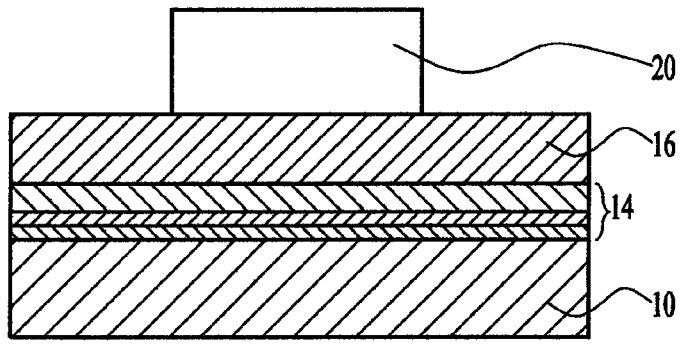
FIGS. 1 through 4 illustrate in cross-sectional representation steps in a preferred embodiment of the present disclosure.

The new MTJ etching mask of the present disclosure will be described in more detail with reference to the drawing FIGS. 1-4. Referring now more particularly to FIG. 1, there is shown a bottom electrode layer 10. On the bottom electrode have been formed a stack of layers 14 that will be patterned to form a MTJ structure. A layer 16 of Ta, or alternately tantalum nitride (TaN), titanium (Ti), titanium nitride (TiN), tungsten (W), or the like, is deposited on the MTJ stack 14. This Ta layer, or electrode layer, 16 should have a thickness of between about 380 and 1000 Angstroms. A photoresist layer is deposited to a thickness of between about 1000 and 4700 Angstroms and patterned to form photoresist mask 20.

Since the PR layer is coated on Ta instead of transparent $SiO_2$ or $SiN_X$, a better profile PR mask 20 can be obtained.

Figure 2:
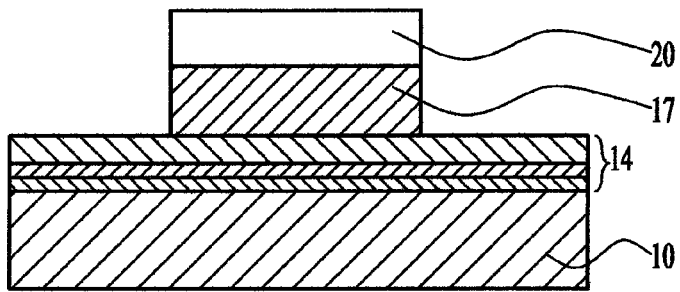

Now, referring to FIG. 2, the Ta or electrode layer mask 17 is defined by the PR mask 20, using reactive ion etching (RIE) with Fluorine or Chlorine based chemicals.

One more step is added after Ta etching, but before stripping the PR mask. A passivation step is performed by flowing $O_2$, $H_2O$ vapor, or air into the etching chamber or by low power $O_2$ plasma after Ta etching. Alternatively, the wafer can be exposed to the ambient air or be water rinsed after etching. This step is critical to form smooth sidewalls and a uniform shape of the device.

The passivation step after Ta-etching is critical for the Ta (or TaN, Ti, TiN, W, etc.)/PR etching mask. Without passivation or with insufficient passivation, the shape of the MTJ device will be impacted due to the fencing issue, which will lead to rough device sidewalls and a non-uniform shape of the device. The current tool has limitations on $H_2O$ vapor and air flow and $O_2$ flow rate and pressure, so we can use the alternative method for passivation, which is low power $O_2$ plasma treatment or exposure of the wafer to the ambient air or water rinsing the wafer. The exposure time has been found to be not very critical to the smoothness of the sidewall. For example, preferred flow rates for $H_2O$ vapor or $O_2$ or air are between about 500 and 3000 sccm, at a pressure of between about 1 and 3 Torr. The preferred $O_2$ plasma treatment is low power (source power<100 W, and bias power=0).

As another alternative, the passivation may be performed during the Ta etching step instead of after the Ta etching by flowing $H_2O$ vapor or $O_2$ or air into the etching chamber along with the etching gases. For example, preferred flow rates for $H_2O$ vapor or $O_2$ or air are between about 500 and 1000 sccm, at a pressure of between about 1 and 3 Torr.

Sometimes, if the electrode layer 18 is thicker than 380 Angstroms, the metal etch needs to be separated into two or more steps, and the passivation is required between every two steps.

Figure 3:
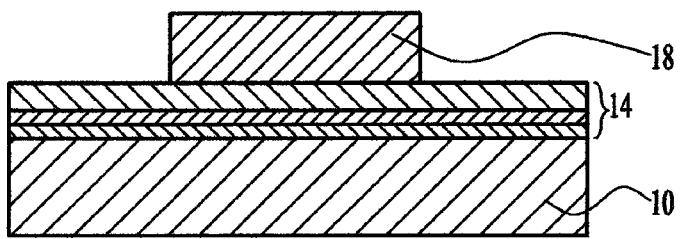

The critical passivation step before PR removal provides a very uniform electrode mask 18 with smooth sidewalls. Now, the PR mask 20 is removed using conventional stripping methods, leaving Ta or electrode mask 18 on the MTJ layer stack, as shown in FIG. 3.

Figure 4:
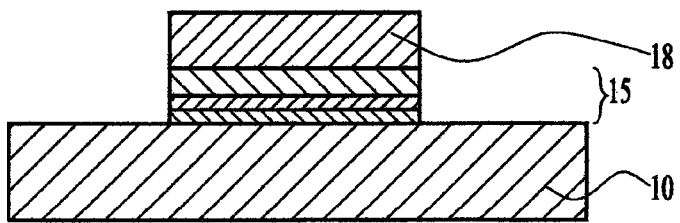

The passivated mask 18 then is used as the MTJ etching mask to etch the MTJ device 15, by either RIE or ion beam etching (IBE) as shown in FIG. 4. The MTJ is etched using $CH_3OH$ based chemicals or CO and $NH_3$-based chemicals. For example, the etchant can be $CH_3OH$ or $CH_3OH$ with other gases such as Ar, $O_2$, $H_2$, $N_2$, or the like.

The remaining mask 18 is used as the top electrode after the MTJ etch. It should be noted that a thick Ta layer is required for IBE due to poor selectivity of IBE. The method of the present disclosure can be also beneficial because this new method can etch thicker Ta with the same thickness of PR.

The new MTJ etch process of the present disclosure using Ta (or TaN, Ti, TiN, W, etc.)/PR etching mask with added passivation step can give us a better PR profile because:

the PR is coated on metal instead of on transparent $SiO_2$ or $SiN_x$ there are fewer pattern transfer steps the $SiO_2$ or $SiN_x$ striation effect is avoided the hard mask has a smooth profile resulting in a better etching profile and better uniformity of the MTJ device within the wafer and within the chip a thicker Ta layer can be etched using the same thickness of PR, which will provide a larger CMP process window, and leave enough thickness of Ta as the top electrode of the MTJ.

The present disclosure provides an improved process for MTJ etching by using a simple Ta/PR etching mask stack and by adding a passivation step during or after metal etching and prior to PR stripping. A better photoresist and etch profile and better uniformity within the chip and across the wafer are obtained. The passivation step by $O_2$, $O_2$ plasma, $H_2O$ vapor, $H_2O$, or air is critical to obtain smooth sidewalls and uniform devices. This simple mask stack also can be beneficial to etch a thicker top electrode (Ta).

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising: providing a stack of MTJ layers on a bottom electrode; depositing a metal electrode layer on said stack of MTJ layers; forming a photoresist mask on said metal electrode layer; etching away said metal electrode layer where it is not covered by said photoresist mask to form a metal hard mask; passivating said metal hard mask by purging O2, H2O vapor, or air into the etching chamber or by low power O2 plasma treatment or by exposing said metal hard mask to ambient air or by water rinse during or after said etching away of said electrode layer wherein after said passivating, said metal hard mask has smooth sidewalls; thereafter removing said photoresist mask; and etching said MTJ stack using passivated said metal hard mask, after said passivating said metal hard mask and removing said photoresist mask, wherein said metal hard mask remaining acts as a top electrode.

2. The method according to claim 1 wherein said metal electrode layer comprises Ta, TaN, Ti, TiN, or W having a thickness of between about 380 and 1000 Angstroms.

3. The method according to claim 1 wherein said photoresist mask has a thickness of between about 1000 and 4700 Angstroms.

4. The method according to claim 1 wherein said metal hard mask layer is etched using Fluorine or Chlorine based chemicals.

5. The method according to claim 1 wherein said step of passivating said metal hard mask is performed by partially etching away said metal electrode layer not covered by said photoresist mask, exposing said metal electrode layer to ambient air, or water rinsing the wafer, or purging $O_2$, $H_2O$ vapor or air into the etching chamber, and etching away said metal electrode layer some more wherein said steps of etching away said metal electrode layer and exposing said metal electrode layer to ambient air, or water rinsing the wafer, purging $O_2$, $H_2O$ vapor or air into the etching chamber are repeated as necessary until said hard mask layer is completely formed and passivated.

6. The method according to claim 1 wherein said MTJ stack is etched using reactive ion etching or ion beam etching.

7. The method according to claim 1 wherein said top electrode has a thickness of at least 38 nm.

8. A method for etching a magnetic tunneling junction (MTJ) structure comprising: providing a stack of MTJ layers on a bottom electrode; depositing an electrode layer on said stack of MTJ layers wherein said electrode layer is composed of Ta, TaN, Ti, TiN, or W; forming a photoresist mask on said electrode layer; etching away said electrode layer where it is not covered by said photoresist mask to form a metal hard mask; passivating said metal hard mask by purging O2 or H2O vapor or ambient air into the etching chamber, or by O2 plasma treatment wherein after said passivating, said metal hard mask has smooth sidewalls; thereafter removing said photoresist mask; and etching said MTJ stack using passivated said metal hard mask, after said passivating said metal hard mask and removing said photoresist mask, wherein said metal hard mask remaining acts as a top electrode.

9. The method according to claim 8 wherein said electrode layer has a thickness of between about 380 and 1000 Angstroms.

10. The method according to claim 8 wherein said photoresist mask has a thickness of between about 1000 and 4700 Angstroms.

11. The method according to claim 8 wherein said metal hard mask layer is etched using Fluorine or Chlorine based chemicals.

12. The method according to claim 8 wherein said purging $O_2$ or $H_2O$ vapor or ambient air into the etching chamber is performed after said etching away of said electrode layer.

13. The method according to claim 8 wherein said purging $O_2$ or $H_2O$ vapor or ambient air into the etching chamber is performed during said etching away of said electrode layer.

14. The method according to claim 8 wherein said purging $O_2$ or $H_2O$ vapor or ambient air into said etching chamber is performed after said etching away or partially etching away of said electrode layer.

15. The method according to claim 8 wherein said MTJ stack is etched using reactive ion etching or ion beam etching.

16. The method according to claim 8 wherein said top electrode has a thickness of at least 38 nm.

17. A method for etching a magnetic tunneling junction (MTJ) structure comprising: providing a stack of MTJ layers on a bottom electrode; depositing a metal electrode layer on said stack of MTJ layers; forming a photoresist mask on said metal electrode layer; partially etching away said metal electrode layer where it is not covered by said photoresist mask; exposing said metal electrode layer to ambient air, or water rinsing the wafer, or purging O2, H2O vapor or air into the etching chamber, and etching away said metal electrode layer some more wherein said steps of etching away said metal electrode layer and exposing said metal electrode layer to ambient air, or water rinsing the wafer, purging O2, H2O vapor or air into the etching chamber are repeated as necessary to form a metal hard mask layer and to passivate said metal hard mask wherein after passivating, said metal hard mask has smooth sidewalls; thereafter removing said photoresist mask; and etching said MTJ stack using passivated said metal hard mask, after said passivating said metal hard mask and removing said photoresist mask, wherein said metal hard mask remaining acts as a top electrode.

\* \* \* \* \*